(12) United States Patent  (10) Patent No.: US 7,487,825 B2
Yu et al.  (45) Date of Patent: Feb. 10, 2009

(54) HEAT DISSIPATION DEVICE

(75) Inventors: Guang Yu, Shenzhen (CN); Yong-Dong Chen, Shenzhen (CN); Shih-Hsun Wung, Tu-Cheng (TW); Chun-Chi Chen, Tu-Cheng (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 84 days.

(21) Appl. No.: 11/309,932

(22) Filed: Oct. 31, 2006

(65) Prior Publication Data

US 2008/0101027 A1    May 1, 2008

(51) Int. Cl.
*F28D 15/00*    (2006.01)
*H05K 7/20*    (2006.01)

(52) U.S. Cl. .............. 165/185; 165/104.21; 165/104.33

(58) Field of Classification Search ............ 165/104.21, 165/104.33, 80.3, 104.34, 185; 361/700, 361/704; 257/715; 174/15.2, 16.3

See application file for complete search history.

(56) References Cited

U.S. PATENT DOCUMENTS

| | | | |
|---|---|---|---|
| 2003/0173061 A1* | 9/2003 | Lai et al. | 165/80.4 |
| 2005/0224217 A1* | 10/2005 | Whitney | 165/104.33 |
| 2006/0082972 A1* | 4/2006 | Kim | 361/709 |
| 2006/0158850 A1* | 7/2006 | Lee et al. | 361/700 |
| 2006/0203451 A1* | 9/2006 | Wei et al. | 361/700 |
| 2006/0227506 A1* | 10/2006 | Lee et al. | 361/697 |
| 2007/0000646 A1* | 1/2007 | Chen et al. | 165/104.33 |
| 2007/0051498 A1* | 3/2007 | Xia et al. | 165/100 |

* cited by examiner

*Primary Examiner*—Tho v Duong
(74) *Attorney, Agent, or Firm*—Frank R. Niranjan

(57) ABSTRACT

A heat dissipation device includes a heat sink (10) and a first heat pipe (20) enclosing a bottom edge of the heat sink. The heat sink includes a base (12) defining a first passage (120) extending therethrough. The first heat pipe includes a first transferring section (22) extending in the first passage and totally embedded in the base and a pair of first dissipating sections (24) extending from the first transferring section. The first dissipating sections of the first heat pipe are attached on an outer periphery of the base. The first transferring section of the first heat pipe absorbs heat in the middle of the base and transfers it to the first dissipating sections to evenly distribute the heat throughout the whole base.

9 Claims, 5 Drawing Sheets

HEAT DISSIPATION DEVICE

FIELD OF THE INVENTION

The present invention relates to a heat dissipation device, more particularly to a heat dissipation device using heat pipes for enhancing heat removal from heat generating electronic devices.

DESCRIPTION OF RELATED ART

As computer technology continues to advance, electronic components such as central processing units (CPUs) of computers are being made to provide faster operational speeds and greater functional capabilities. When a CPU operates at high speed in a computer enclosure, its temperature can increase greatly. It is desirable to dissipate the heat quickly, for example by using a heat dissipation device attached to the CPU in the enclosure. This allows the CPU and other electronic components in the enclosure to function within their normal operating temperature ranges, thereby assuring the quality of data management, storage and transfer.

A conventional heat dissipation device comprises a heat sink and a heat pipe. The heat sink comprises a base and a plurality of fins extending from the base. The base defines a groove in a top surface thereof, and a bottom surface of the base is attached to an electronic component. The heat pipe has an evaporating portion accommodated in the groove and a condensing portion inserted in the fins. The base absorbs heat produced by the electronic component and transfers the heat directly to the fins through the heat pipe. By the provision of the heat pipe, heat dissipation efficiency of the heat dissipation device is improved.

As the CPU and other electronic components generate more heat, the heat removal capability of the conventional heat dissipation device is frequently not sufficient and heat of the base is not evenly distributed. Usually, more heat pipes can be added to improve the heat removal capability of the conventional heat dissipation device and thus solve this problem.

However, when more heat pipes are added this leads to an increase in cost of the whole heat dissipation device. Furthermore, It is both complex and cumbersome to attach more than two heat pipes to a heat sink. Therefore, it is desirable to provide a heat dissipation device that eliminates the aforementioned problems.

SUMMARY OF THE INVENTION

A heat dissipation device includes a heat sink and a first heat pipe enclosing a bottom edge of the heat sink. The heat sink includes a base defining a first passage extending therethrough. The first heat pipe includes a first transferring section extending in the first passage and a pair of first dissipating sections extending from opposite ends of the first transferring section. The first dissipating sections of the first heat pipe are attached to an outer periphery of the base. The first transferring section of the first heat pipe absorbs heat in the middle of the base and transfers it to the first dissipating sections to evenly distribute the heat in the whole base.

Other advantages and novel features will become more apparent from the following detailed description of preferred embodiments when taken in conjunction with the accompanying drawings, in which:

BRIEF DESCRIPTION OF THE DRAWINGS

Many aspects of the present apparatus and method can be better understood with reference to the following drawings. The components in the drawings are not necessarily drawn to scale, the emphasis instead being placed upon clearly illustrating the principles of the present apparatus and method. Moreover, in the drawings, like reference numerals designate corresponding parts throughout the several views.

DETAILED DESCRIPTION OF THE INVENTION

Figure 1:
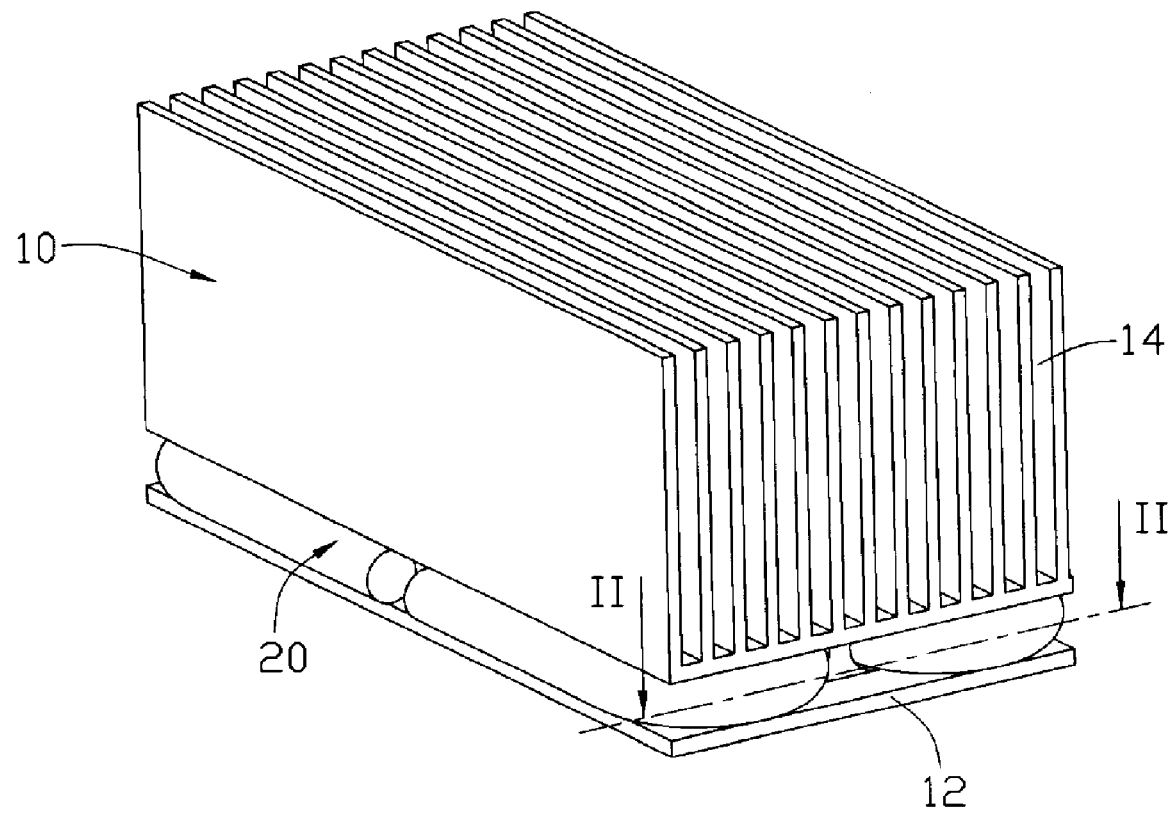
FIG. 1 is assembled view of a heat dissipation device in accordance with a preferred embodiment of the present invention.

Referring to FIG. 1, a heat dissipation device in accordance with a preferred embodiment of the present invention is illustrated. The heat dissipation device, which is used to cool down a heat-generating electronic component (not shown) such as a central processing unit (CPU) mounted on a printed circuit board (not shown), comprises a heat sink 10 and two curved heat pipes 20 enclosing a bottom edge of the heat sink 10. The heat sink 10 comprises a base 12 and an array of fins 14 extending from the base 12. The heat pipes 20 are attached to an outer periphery of the base 12.

Figure 2:
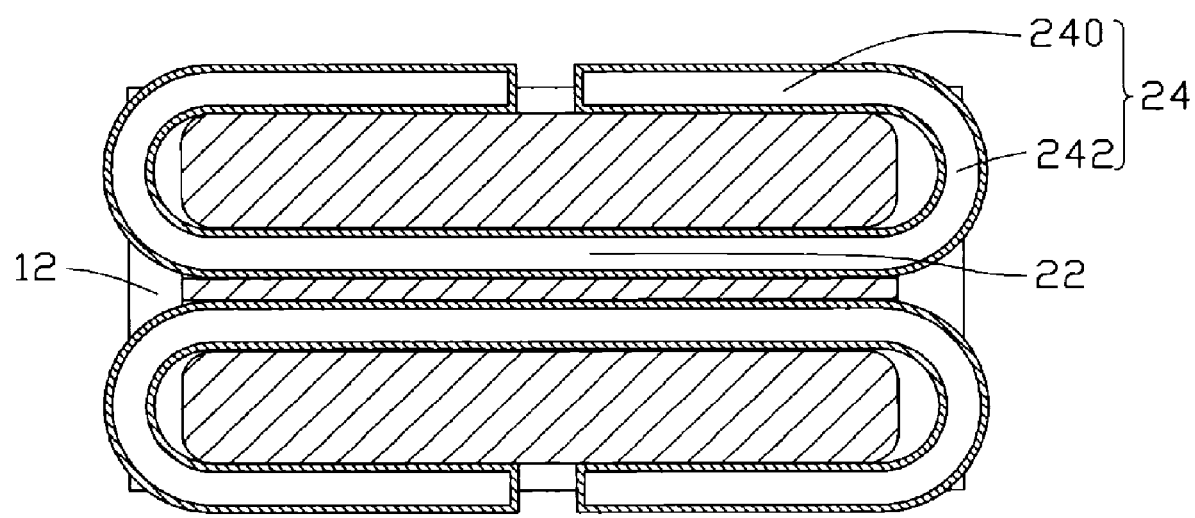
FIG. 2 is a cross-sectional view of the heat dissipating device taken along line II-II in FIG. 1.
Figure 3:
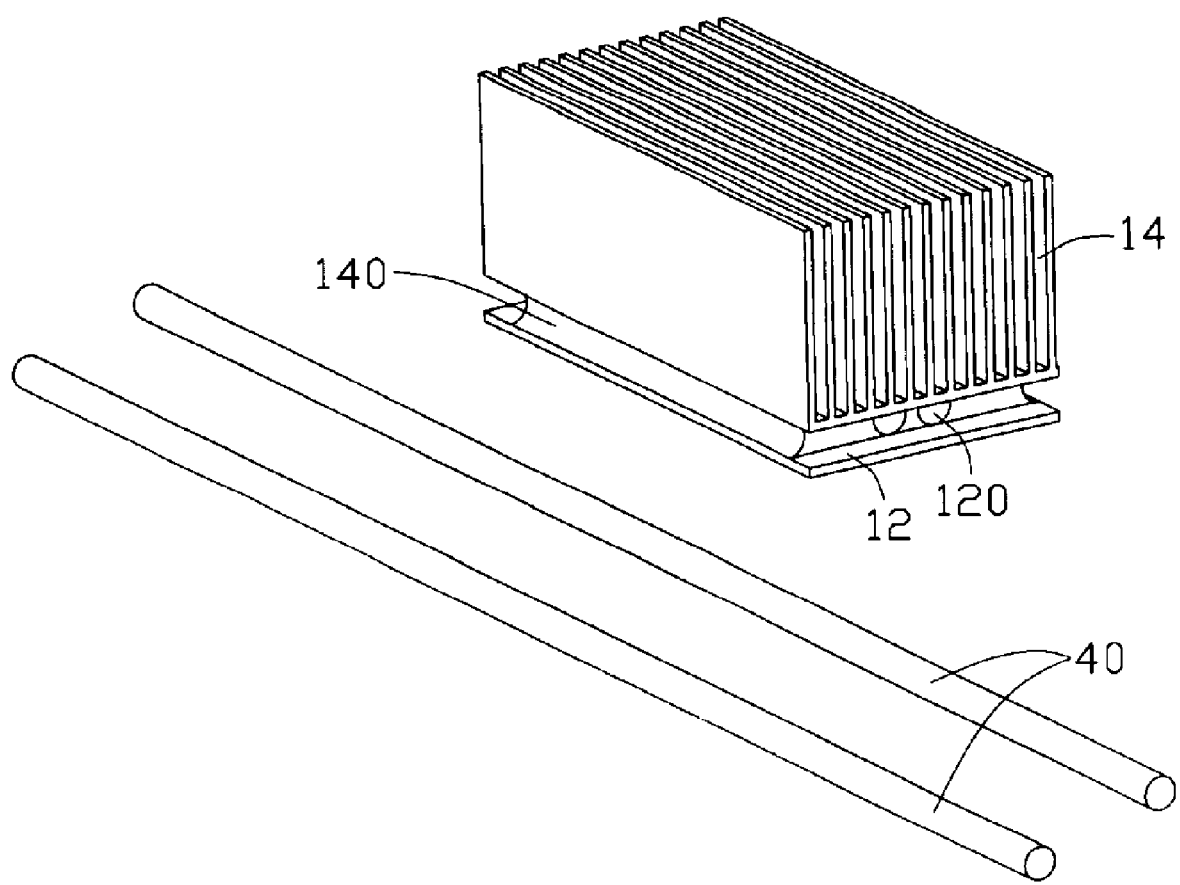
FIGS. 3-4 show a process of assembling the heat dissipating device of FIG. 1.
Figure 4:
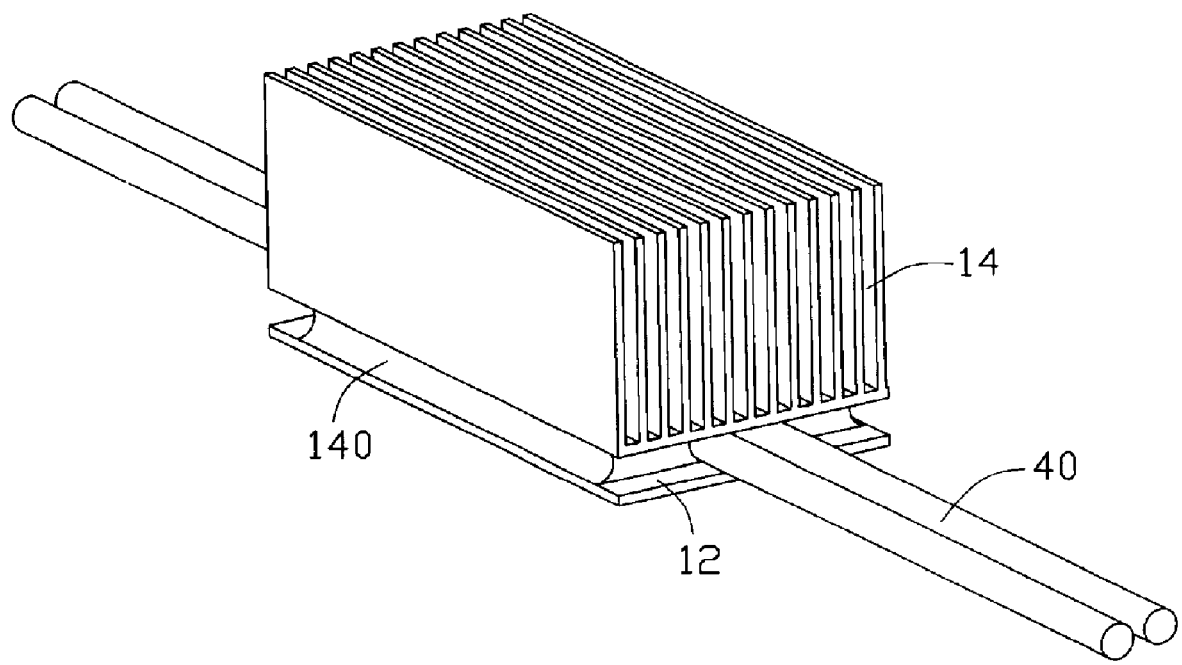

Referring to FIGS. 2-4, the base 12 is substantially rectangular, and made of thermal conductive material such as copper or aluminum. The base 12 has a flat top surface (not labeled) and a flat bottom surface (not labeled) adapted for attachment with the heat-generating electronic component (not shown). The array of fins 14 is upwardly extended from the flat top surface (not labeled). A pair of parallel passages 120 are defined through a middle of the base 12 in a longitudinal direction that is parallel to the array of fins 14, for the heat pipes 20 extending in. Each passage 120 is wholly enclosed by the base 12, except two opposite ends thereof. An annular slot 140 is defined in the outer periphery of the base 12, which avails to accept the heat pipes 20 around the base 12 to save space. The slot 140 is so oriented that its opening faces outwards away from the base 12.

Each heat pipe 20 comprises a first transferring section 22 parallel to each other and a pair of L-shaped first dissipating sections 24 inwardly extending toward each other from opposing free ends of the first transferring section 22. Each first dissipating section 24 comprises a main body 240 parallel to the first transferring section 22 and attached to the outer periphery of the base 12 and a connecting section 242 between the first transferring section 22 and the main body 240. The main bodies 240 of the first dissipating sections 24 of each heat pipe 20 are arranged at a same lateral side of the base 12 and parallel to the first transferring section 22. The first transferring sections 22 of the heat pipes 20, which function as evaporating sections, are fixed in the passages 120 of the base 12 by soldering. The first dissipating sections 24 of the heat pipes 20 which function as condensing sections enclose the base 12 and are received in the slot 140. The heat pipes 20 are disposed symmetrically along a midline of the base 12. The heat pipes 20 are so oriented that they open in opposite directions. The first transferring sections 22 are totally embedded in the base 12 so that they can have a large contact surface with the base 12.

Referring also to FIGS. 1 and 3-4, in assembly, firstly a pair of straight heat pipes 40 are provided; then the straight heat pipes 40 are inserted into corresponding passages 120 of the base 12 until middle sections of the heat pipes 40 are accommodated in the passages 120 of the base 12. Opposite end sections of the heat pipes 40 are then curved to enclose the base 12 and attach to the outer periphery of the base 12, whereby the heat pipes 40 are bent to become the heat pipes 20 in FIG. 1. Finally, the heat pipes 20 are soldered in the base 12 by thermal conductive material, such as tin. This assembly manner can reduce damage caused to the base 12 and the heat pipes 20 and involves less manufacturing difficulty in disposing the heat pipes 20 in the base 12.

In operation, the base 12 absorbs heat originating from the heat-generating electronic component (not shown) and the heat is conducted to the first transferring sections 22 of the heat pipes 20, where the heat can be quickly transferred to the first dissipating sections 24 of the heat pipes 20. The heat concentrated in the middle of the base 12 can be transferred to the periphery of the base 12 by the heat pipes 20. This serves to uniformly transfer the heat from the middle of the base 12 to four corners of the base 12. In this manner a uniform temperature distribution in the base 12 is achieved, thus allowing uniform transfer of heat from the base 12 to the array of fins 14 to improve the heat dissipation of the array of fins 14, thus promoting the efficiency of the heat dissipation device.

Figure 5:
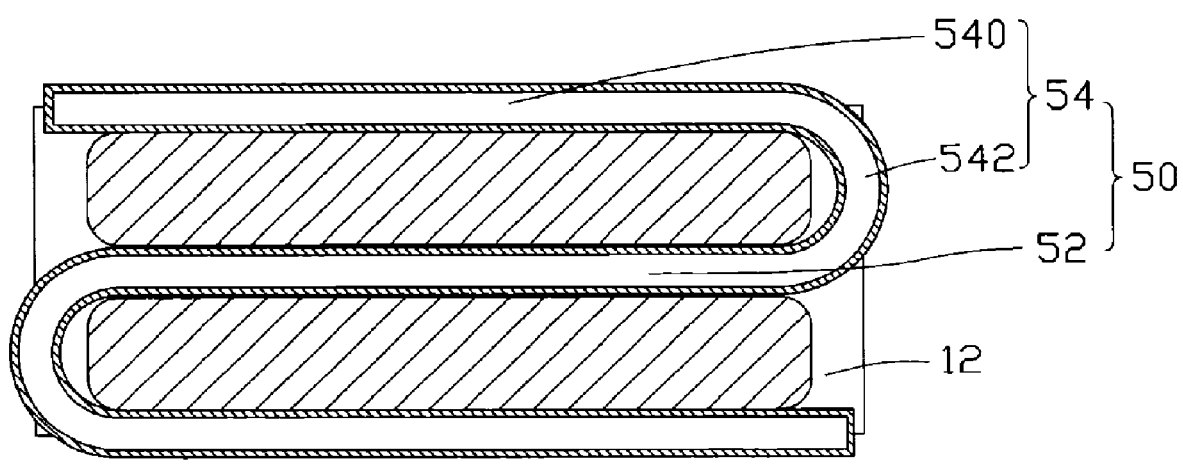
FIG. 5 is a cross-sectional view of a heat dissipation device in accordance with a second embodiment of the present invention.

It is understood that such a configuration of the heat pipes 20 surrounding the base 12 as is seen in the preferred embodiment of the prevent invention can also be achieved using only one heat pipe. FIG. 5 illustrates a cross-sectional view of a heat dissipation device in accordance with a second embodiment of the present invention. The heat pipe 50 is S-shaped and comprises a first transferring section 52 and a pair of first dissipating sections 54 extending from opposite ends of the first transferring section 52. The first transferring section 52 functions as an evaporating section and is disposed in the middle of the base 12. The first transferring section 52 is totally embedded in the base 12. The first dissipating sections 54 of the heat pipe 50 outwardly extend in opposite directions and are arranged at opposite lateral sides of the base 12. Each first dissipating section 54 comprises a main body 540 parallel to the first transferring section 52 and a connecting section 542 bent from a free end of the first transferring section 52 and between the first transferring section 52 and the main body 540. The main bodies 540 are parallel to the first transferring section 52 of the heat pipe 50, and attached to the outer periphery of the base 12.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
a heat sink comprising a single-pieced base, the base having a bottom surface adapted for attachment of a heat generating element and a top surface, and the base defining a slot in and along an outer periphery of the base and between the top and bottom surfaces of the base; and
a first heat pipe comprising a first transferring section extending in the base and located between the top and bottom surfaces of the base and a pair of first dissipating sections extending from opposite free ends of the first transferring section, the first dissipating sections being received in the slot of the base and attaching on the outer periphery of the base and located between the top and bottom surfaces of the base.

2. The heat dissipation device as claimed in claim 1, further comprising a second heat pipe comprising a second transferring section parallel to the first transferring section of the first heat pipe and a pair of second dissipating sections extending from opposite free ends of the second transferring section.

3. The heat dissipation device as claimed in claim 2, wherein the first and second heat pipes are oriented at opposite directions.

4. The heat dissipation device as claimed in claim 3, wherein the first dissipating sections of the first heat pipe are inwardly bent toward each other and attached on a same lateral side of the base, and the second dissipating sections of the second heat pipe are inwardly bent toward each other and attached on another same lateral side of the base.

5. The heat dissipation device as claimed in claim 4, wherein the first and second dissipating sections are both L-shaped and both comprise a main body extending parallel to the other and attaching on the outer periphery of the base.

6. The heat dissipation device as claimed in claim 1, wherein the first heat pipe is S-shaped and the first dissipating sections of the first heat pipe are attached on opposite lateral sides of the base, each one extending in a direction opposite to the other.

7. The heat dissipation device as claimed in claim 6, wherein the first dissipating sections are parallel to the first transferring section of the first heat pipe.

8. The heat dissipation device as claimed in claim 6, wherein the base defines a passage extending therethrough and the first transferring section of the first heat pipe is accommodated in the passage and totally embedded in the base.

9. The heat dissipation device as claimed in claim 1, wherein the heat sink comprises a plurality of fins extending from the top surface of the base.

* * * * *